(12) United States Patent
Platzgummer et al.

(10) Patent No.: US 7,276,714 B2
(45) Date of Patent: Oct. 2, 2007

(54) ADVANCED PATTERN DEFINITION FOR PARTICLE-BEAM PROCESSING

(75) Inventors: Elmar Platzgummer, Vienna (AT); Stefan Cernusca, Vienna (AT)

(73) Assignee: IMS Nanofabrication GmbH, Vienna (AT)

( * ) Notice: Subject to any disclaimer, the term of this patent is extended or adjusted under 35 U.S.C. 154(b) by 356 days.

(21) Appl. No.: 11/119,025

(22) Filed: Apr. 29, 2005

(65) Prior Publication Data

US 2005/0242302 A1  Nov. 3, 2005

(30) Foreign Application Priority Data

Apr. 30, 2004 (AT) ............... A 755/2004
Sep. 6, 2004 (AT) ............... A 1492/2004

(51) Int. Cl.
*G21K 6/10* (2006.01)
(52) U.S. Cl. ............ 250/492.22; 250/492.23; 250/492.1; 250/492.2
(58) Field of Classification Search ........ 250/492.22, 250/492.23
See application file for complete search history.

(56) References Cited

U.S. PATENT DOCUMENTS

| | | | |
|---|---|---|---|
| 4,985,634 A | 1/1991 | Stengl et al. | |
| 5,260,579 A | 11/1993 | Yasuda et al. | |
| 5,359,202 A | 10/1994 | Yasuda et al. | |
| 5,369,282 A | 11/1994 | Arai et al. | |
| 5,801,388 A | 9/1998 | Stengl et al. | |
| 6,326,632 B1 | 12/2001 | Buschbeck et al. | |
| 6,768,125 B2 | 7/2004 | Platzgummer et al. | |
| 2005/0087701 A1 | 4/2005 | Lammer-Pachlinger et al. | |

OTHER PUBLICATIONS

I.L. Berry et al., Programmable Aperture Plate for Maskless High-Throughput Nanolithography, J. Vac. Sci. Technol. B 15 (1997), pp. 2382-2386, US.

M. Muraki et al., New Concept for High-Throughput Multielectron Beam Direct Wire System, J. Vac. Sci. Technol. B 18(6), pp. 3061-3066, US.

*Primary Examiner*—David Vanore
(74) *Attorney, Agent, or Firm*—RatnerPrestia

(57) ABSTRACT

In a pattern definition device for use in a particle-beam processing apparatus a plurality of apertures (21) are arranged within a pattern definition field (pf) wherein the positions of the apertures (21) in the pattern definition field (pf) taken with respect to a direction (X, Y) perpendicular, or parallel, to the scanning direction are offset to each other by not only multiple integers of the effective width (w) of an aperture taken along said direction, but also multiple integers of an integer fraction of said effective width. The pattern definition field (pf) may be segmented into several domains (D) composed of a many staggered lines (pl) of apertures; along the direction perpendicular to the scanning direction, the apertures of a domain are offset to each other by multiple integers of the effective width (w), whereas the offsets of apertures of different domains are integer fractions of that width.

19 Claims, 12 Drawing Sheets

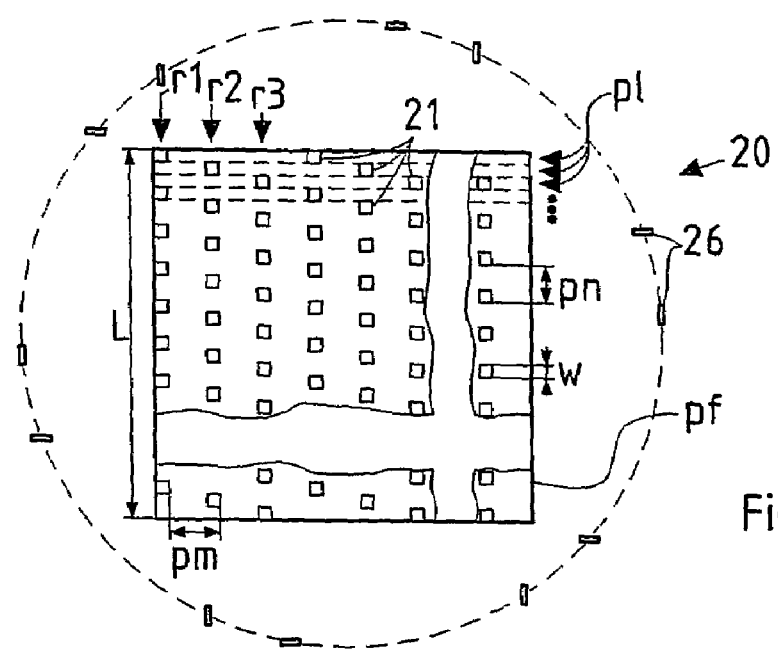
Fig. 2
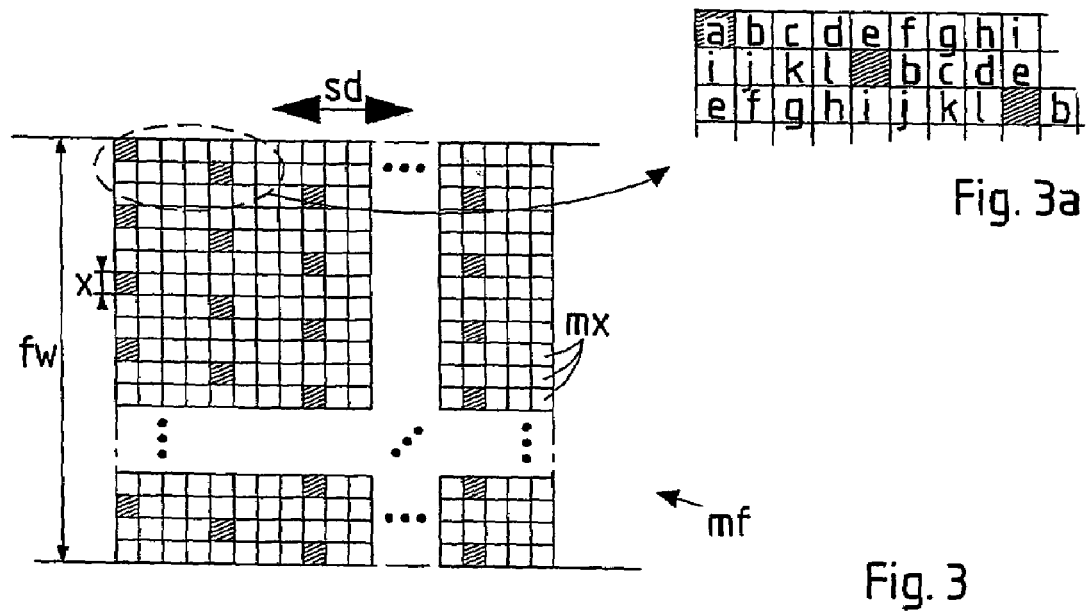
Fig. 3a
Fig. 3

{0, 0}  {½, ½}  {0, ½}  {½, 0}  {¼, ¼}  {¼, ¾}  {¾, ¼}  {¾, ¾}

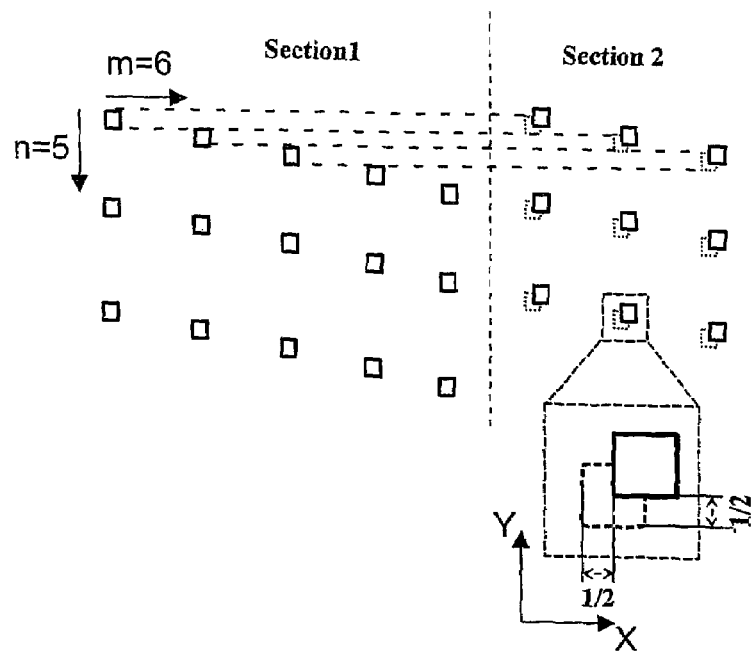
Fig. 10
Fig. 10a
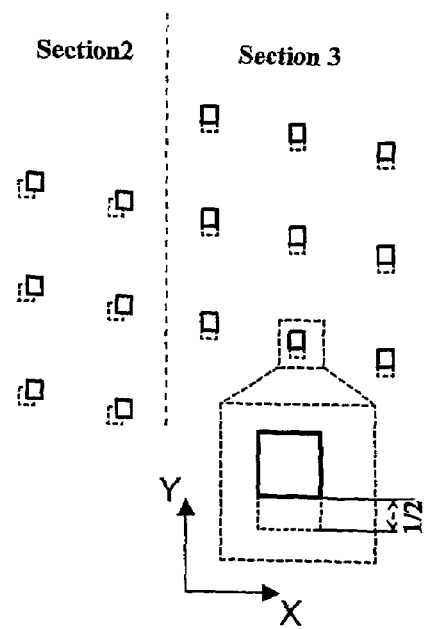
Fig. 11
Fig. 11a

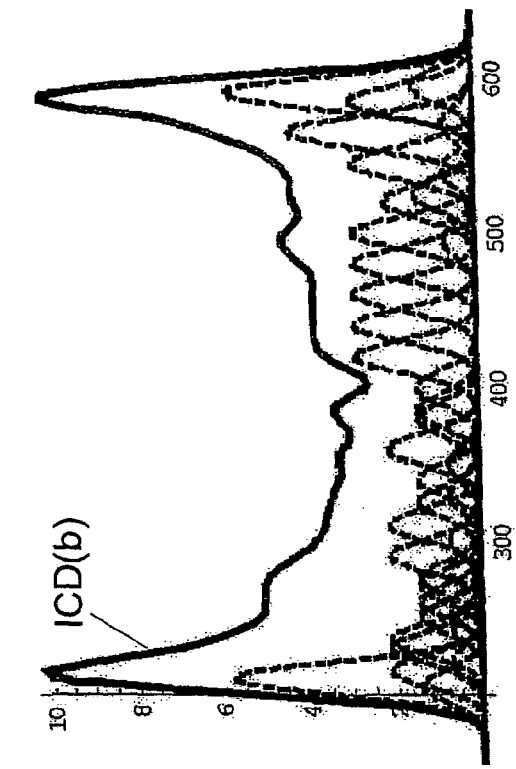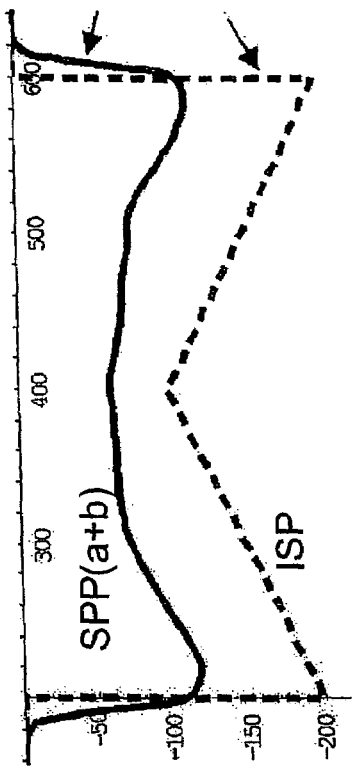
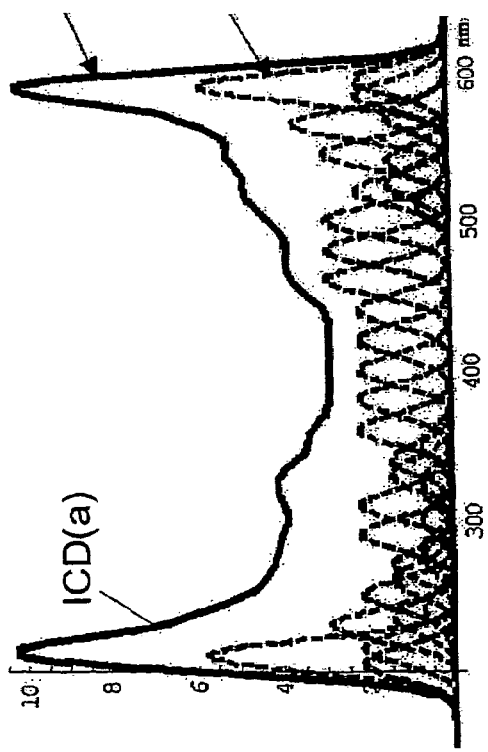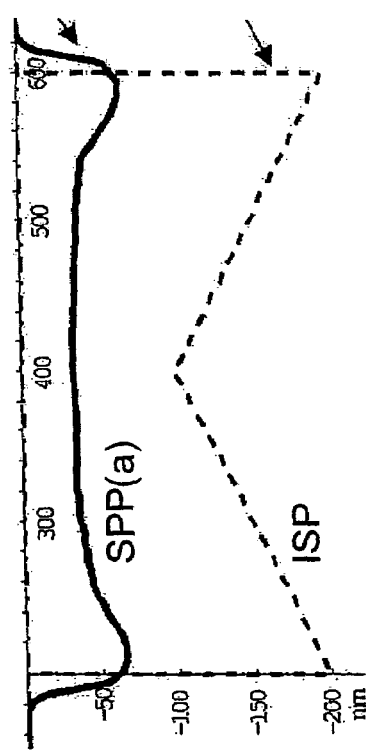
Fig. 14
Fig. 15

ADVANCED PATTERN DEFINITION FOR PARTICLE-BEAM PROCESSING

CROSS-REFERENCE TO RELATED APPLICATIONS

This application claims the benefit of Austrian Patent Application Serial Nos. A 755/2004, filed 30 Apr. 2004 and A 1492/2004, filed 6 Sep. 2004

FIELD OF THE INVENTION AND DESCRIPTION OF PRIOR ART

The invention relates to improvements of a multi-beam pattern definition device for use in a particle-beam processing apparatus.

More in detail, the invention relates to a pattern definition device for use in a particle-beam processing apparatus, which device is adapted to be irradiated with a beam of electrically charged particles and allow passage of the beam only through a plurality of apertures which are of identical shape and define the shape of beamlets permeating them; the apertures are arranged within a pattern definition field according to a specific arrangement for defining the pattern on a target; with said apertures are associated corresponding blanking openings located such that each of the beamlets traverses that blanking opening which corresponds to the aperture defining the beamlet respectively, and each blanking opening is provided with a deflection means that can be controlled by a blanking signal between two deflection states, namely, a first state ('switched on') when the deflection means has assumed a state in which particles radiated through the opening are allowed to travel along a desired path, and a second state ('switched off') when the deflection means is deflecting particles radiated through the opening off said path.

In other words, the particle beam is generated by an illumination system, and it illuminates a pattern definition (PD) means having an array of apertures which define a beam pattern to be projected on a target surface. The passage of each beam through an aperture can be controlled so as to allow ('switch on') or effectively deactivate ('switch off') the passage of particles of the beam through the respective apertures. The beam permeating the aperture array (or more exactly, through the switched-on apertures of the array) forms a patterned particle beam bearing a pattern information as represented by the spatial arrangement of the apertures. The patterned beam is then projected by means of a particle-optical projection system onto the target (for instance, a semiconductor substrate) where an image of the apertures is thus formed to modify the target at the irradiated portions.

One important application of processing apparatus of this kind is in the field of nano-scale patterning, by direct ion beam material modification or ion beam induced etching and/or deposition, used for the fabrication or functionalization of nano-scale devices, particularly having sub-100 nm feature sizes. Another important application of processing apparatus of this kind is in the field of particle-beam lithography used in semiconductor technology, as a lithography apparatus, wherein, in order to define a desired pattern on a substrate surface, the wafer is covered with a layer of a radiation-sensitive photoresist, a desired structure is imaged onto the photoresist by means of a lithography apparatus which is then patterned by partial removal according to the pattern defined by the previous exposure step and then used as a mask for further structuring processes such as etching. In the context of this disclosure, however, rather than an indirect process such as a photoresist structuring, the invention is primarily discussed in the context of a direct structuring process which employs an ion beam material modification where the particle beam itself causes modification of the substrate to be structured.

The potential use of an addressable aperture plate for direct pattern transfer by charged particle beam projection has been investigated since more than a decade. One early discussion is given by B. Lischke et al., Microelectronic Engineering 9, 1989, pp. 199-203. Later, in 1997, I. L. Berry et al., in J. Vac. Sci. Technol. B, 15 (6), 1997, pp. 2382-2386, presented a writing strategy based on a blanking aperture array and an ion projection system.

Arai et al., U.S. Pat. No. 5,369,282, discuss an electron-beam exposure system using a so-called blanking aperture array (BAA) which plays the role of the PD means. The BAA carries a number of rows of apertures, and the images of the apertures are scanned over the surface of the substrate in a controlled continuous motion whose direction is perpendicular to the aperture rows. The rows are aligned with respect to each other in an interlacing manner so that the apertures form staggered lines as seen along the scanning direction. Thus, the staggered lines sweep continuous lines on the substrate surface without leaving gaps between them as they move relative to the substrate, thus covering the total area to be exposed on the substrate. In the U.S. Pat. No. 5,369,282, the apertures of every second row align and the pitch between neighboring apertures in a row is twice the width of an aperture; in general, an alignment of rows is possible based on any number n, the pitch then being n times the width of an aperture. Yasuda et al., U.S. Pat. No. 5,359,202 and U.S. Pat. No. 5,260,579 use a similar BAA for exposing a substrate with a pattern, but the need to fed control lines to each of the blanking apertures makes the internal structuring very complex and prone to unwanted disturbing effects such as cross-talking and transit time delays.

The above-mentioned article of I. L. Berry et al. describes a PD device comprising a "programmable aperture array" with an array of 3000×3000 apertures of 5 μm side length with an n=4 alignment of rows and staggered lines. The aperture array contains additional logic circuitry, thus implementing an electronic mask scanning system in which the pattern information is passed by means of shift registers from one aperture to the next within a row. The article proposes to use a 200× demagnification ion-optical system for imaging the apertures of the BAA onto the substrate.

Starting from Berry's concept, E. Platzgummer et al., in the U.S. Pat. No. 6,768,125 (=GB 2 389 454 A), present a multi-beam direct write concept, dubbed PML2 (short for "Projection Mask-Less Lithography #2"), employing a PD device comprising a number of plates stacked on top of the other, among them an aperture array means (aperture plate) and a blanking means (blanking plate). These separate plates are mounted together at defined distances, for instance in a casing. The aperture array means has a plurality of apertures of identical shape defining the shape of beamlets permeating said apertures, wherein the apertures are arranged within a PD field composed of a plurality of staggered lines of apertures, wherein the apertures are spaced apart within said lines by a first integer multiple of the width of an aperture and are offset between neighboring lines by a fraction of said integer multiple width. The blanking means has a plurality of blanking openings arranged in an arrangement corresponding to the apertures of the aperture array means, in particular having corresponding staggered lines of blanking openings. The teaching of the U.S. Pat. No. 6,768,125 with regard to the architecture and operation of the PD device, and in particular the architecture of its blanking plate, are hereby included as part of this disclosure.

According to the PML2 concept, the image formed by the beam is moved continuously along a straight path over each die field; additional scanning of the beam in a direction perpendicular to the scanning direction is not necessary (except, where needed, to compensate for lateral travel motion errors of the scanning stage). Furthermore, gray scales can be generated by subsequent exposures of apertures located in line, so that a shift register approach can be effectively applied to create gray scale patterns (of a predetermined bit size, e.g. 5 or more bits) while only the substrate is moved. The PML2 concept involves the use of a large amount of memory on the aperture plate, located next to the apertures either in between or in the vicinity. A main distinctive feature of the PML2 over prior art is a row offset between blocks of regular apertures on the aperture plate, intended for the placement of shift register electronic circuits on the blanking plate.

The key for the realization of an addressable mask is the so-called Micro-Electro and micro-Mechanical System (MEMS) technology, which allows the monolithic fabrication of hundred thousands up to millions of apertures together with the electronics needed to control the beam switching and data management. Since the minimum feature size of industrial MEMS devices is about 100 to 200 times larger than the typical critical dimension in lithography (for example the size of apertures and micro-deflectors), a powerful large field high resolution optical projection system is obligatory for exploitation of the advanced MEMS fabrication technologies in the field fast writing applications, such as for example mask-less lithography.

The main advantage of the multi-beam approach inherent to the PLM2 is the vast enhancement of the writing speed compared to single beam writers, due to the fact that the charged particle beam comprises a plurality of sub-beams, dynamically structured by an aperture plate including switchable blanker devices. The improved productivity (over other prior art, such as Arai et al. and Yasuda et al.) arises mainly from the following features:

- the possible number of sub-beams directed parallel to the substrate and the possible density of apertures per area is significantly increased, resulting in relaxed requirements for the particle source;
- single beam blanking is achieved by a continuous data stream and a simplified data line architecture, where only one aperture row (=number of lines×one aperture) is to be fed into the PD field per clock cycle, the signal traveling by shift registers over the PD field;
- the influence of space charge is reduced since the beam current is distributed over a large cross section as a consequence of using a broad beam;
- a high degree of redundancy is produced using a large number of fractional exposures (apertures in line) to cumulate the desired exposure dose, which permits a gray scale generation during single pass scanning.

However, with the PLM2 layout, like with other prior art, the following main problems arise:

- using the physical address grid available by the BAA of prior art, in particular Arai et al. and Berry et al., only an insufficient number of gray scale levels is achieved in single pass exposures in order to fulfill lithographic requirements (1 nm address grid for 45 nm node), as the size of the PD field is limited in large field projection systems. The consequences are a poor process latitude, untolerable values for the line edge roughness, which is related to the physical address grid, and insufficient pattern placement accuracy, or in case of a multi pass strategy, reduced throughput and unwanted alignment errors.
- the need for a distortion-free imaging of a large pattern field as a consequence to the requirement to bring thousands of apertures in overlay during the scanning process (to exploit the high redundancy); and
- dealing with an unavoidable current dependent (=pattern dependent) image distortion and de-focusing, limiting the usable current and requiring pattern homogenization, which will involve a time consuming data pre-processing.

SUMMARY OF THE INVENTION

In view of the above, it is the task of the present invention to find a way to overcome the deficiencies of prior art and allow the use of an addressable mask for applications such as mask-less lithography or nano-scale beam patterning applications. A central aim is to enhance the resolution that can be obtained with a PD device, realizing a finer address grid and reducing the line edge roughness despite an unchanged or even reduced number of apertures compared to prior art. Furthermore, it shall allow the irradiation of pixels at the target according to a gray scale, i.e. with exposure levels interpolated between a minimal ('black') and maximal ('white') exposure dose.

This task is solved by a PD device as described in the beginning wherein the positions of the apertures taken with respect to a direction perpendicular to a scanning direction and/or parallel to it are offset to each other by not only multiple integers of the effective width of an aperture taken along said direction, but also by multiple integers of an integer fraction of said effective width—the latter kind of offsets are referred to as 'fractional offsets' in the context of the invention. In this context, 'scanning direction' denotes the direction along which the image of the apertures formed by the charged-particle beam on a target surface is moved over the target surface during an exposure process.

The basic idea of the invention is to realize the positions of the aperture not only along an imaginary basic grid which results when copies of the base shape of the apertures are assembled to a contiguous covering of the plane area, but to multiply the possible positions by interpolating additional imaginary grids. (The base shape is usually a square or rectangle oriented along the scanning direction, but it could be another shape as well, in particular a regular polygon such as a hexagon). These grids mesh into each other, which is why they are referred to as "interlocking grids" in the context of the invention. It should be appreciated that not all points of these grids are occupied by an aperture; in fact, only a small fraction is, since the apertures need sufficient 'solid' space between each other (cf. the discussion below with FIG. 2).

On account of the invention a finer resolution is available on the target surface even though the individual spots formed by each image of an individual aperture are not decreased in size. Furthermore, the invention enables a downscaling of the lithographic node, for example from 45 mn to 32 nm lines and spaces resolution, without simultaneously downscaling the critical dimensions in the PD device. Hence, the invention helps to circumvent the feature size limitation of state-of-the-art MEMS technology. All together, the invention allows to significantly reduce the diameter of the optical beam and the required PD device in PML2 with the purpose to relax optical performance requirements, such as for example the absence of distortion, and to improve productivity by using several columns in parallel.

In a preferred embodiment of the invention, the device comprises an aperture array means for forming a number of beamlets and a blanking means for controlling the passage of selected beamlets. Said aperture array means then has a plurality of apertures of identical shape defining the shape of beamlets permeating said apertures which are arranged within a pattern definition field as described above; and said blanking means has a plurality of blanking openings arranged in an arrangement corresponding to the apertures of the aperture array means.

Preferably, the fractional offsets are integer multiples of $\frac{1}{2^N}$ times the effective width of an aperture, where N is a positive integer, preferably greater than 1.

In a preferred way to arrange the apertures according to the invention the different grids are located on different regions on the aperture field, so as to simplify the overall layout. Accordingly, the pattern definition field may be segmented into several domains, each domain being composed of a plurality of staggered lines of apertures running along the scanning direction, wherein the apertures are spaced apart within said lines by an integer multiple of the effective width of an aperture and are offset between neighboring lines by a fraction of said integer multiple width, wherein along the direction perpendicular to the scanning direction, the apertures of a domain are offset to each other by multiple integers of the effective width of an aperture, whereas the offsets of apertures of different domains are fractional offsets. In this case, in order to facilitate calculation of the irradiation patterns, the domains may have arrangements of apertures which are corresponding as regards the relative position of aperture within each domain. In particular, the domains may have the same number of apertures. Suitable numbers of domains with different fractional offsets are $2^{2N-1}$ or $2^N$ (with the integer N as above), in the latter case the fractional offsets preferably run along a diagonal of an aperture's base shape.

In a preferred embodiment of the invention the group blanking signals are fed to the PD field partly at a side running parallel to the orientation of lines, partly at a side running perpendicular. This further reduces the density of lines at the feeding sites.

In a suitable realization of the aperture arrangement, the shape of the apertures is substantially equivalent to a two-dimensional geometrical base shape of a contiguous covering of the plane, such as a square or a regular hexagon. The advantage of a contiguous covering arrangement is that the influence of the optical imaging blur on the dose distribution on the wafer (=aerial image), in particular on the gray levels needed for a specific feature, is as small as possible, so that an intrinsic radial variation of the optical imaging blur inside the projected image of the PD device can be tolerated. If the blur is in the range of the spot size, the same advantage can be achieved by choosing the area of the apertures substantially equivalent to a two-dimensional geometrical base shape of a contiguous covering of the plane, whereas the shape may differ from that of a contiguous covering, in particular by modifying the edges of a polygonal base shape such as rounding the edges or beveling (canting). The total shape should be enlarged, if necessary, so the total area of the modified shape is kept, and the area of the shape of the apertures is the same as that of the original polygonal base shape. This means, for example, that instead of perfectly square-shaped apertures it is possible to use corner-rounded square shaped apertures with equal area. The latter allows higher tolerances in the fabrication process. In general, a hexagonal arrangement has the advantage that it has the highest possible density of pixels per area combined with the highest degree of symmetry, both improving the achievable line placement precision and line edge roughness at limited number of apertures in the PD means (=limited size of the PD field).

In order to have a reservoir of 'extra' openings which can be accessed when needed, in particular if one or more other blanking openings are found to be defect, additional blanking openings may be provided which are activated or deactivated for operation. The activation/deactivation can, for instance, be done by a structuring step such as irradiation by focused ion, electron or laser beam. Thus, blanking opening may be provided for which the line feeding the respective blanking signal to said blanking opening(s) comprises a component which is accessible on a surface of the device by a structural modification and which is adapted to change its transmissivity for the group blanking signal between an electrically connecting state and a blocking state upon treatment by said structural modification. In particular, the component may be realized as a conductor segment adapted to be modified, possibly irreversibly, between an electrical well-conducting and a non-conducting state.

In a further aspect of the invention, in order to realize an efficient provision of the blanking signals to the individual blanking openings, the blanking signals are derived from feeding lines, each feeding line serving blanking signals for a number of blanking openings, which are propagated through a series of shift registers into a sequence of intermediate buffer means, one buffer means for each blanking opening, and the data contained in the buffer means are activated by a common trigger signal. In this case, the blanking signal for each blanking opening may be a multi-bit signal, said signal coding a duration of how long within one exposure time the respective aperture is switched on—in terms of a fraction between zero (switched off) and one (fully switched on).

Preferably, the blanking is done by a small change to the angle of the beamlet which is deflected only so far that it does not reach the target or any of the devices at the target position. To this end, the deflection means may be adapted to deflect, in the switched off state, the particles to an absorbing surface of the exposure apparatus mounted after the PD device as seen in the direction of the particle beam.

BRIEF DESCRIPTION OF THE DRAWINGS

In the following, the present invention is described in more detail with reference to the drawings, which show:

FIG. 2 a plan view of one possible aperture arrangement in a PD device of the lithography apparatus of FIG. 1;

FIG. 3 an image field as present on a substrate surface with the aperture arrangement of FIG. 2;

FIG. 10 a detail of FIG. 8 showing the position of apertures of the first two domains, with FIG. 10a showing a detail of one aperture of the second domain and the associated fractional offset;

FIG. 11 another detail of FIG. 8 showing the position of apertures of the second and third domains, with FIG. 11a showing a detail of one aperture of the third domain and the associated fractional offset;

FIGS. 14 to 17 the progress of a trench-sputter process in four steps;

DETAILED DESCRIPTION OF THE INVENTION

Pattern Definition System

The preferred embodiments of the invention discussed in the following are based on the pattern definition (PD) system disclosed in the U.S. Pat. No. 6,768,125, used in a ion-beam processing apparatus. In the following, the technical background of the PD system, as far as relevant to the invention, is first discussed with reference to FIGS. 1 to 5 (which correspond, with modifications where appropriate, those of the U.S. Pat. No. 6,768,125), then embodiments of the invention in the PD system are discussed. It should be appreciated that the invention is not restricted to the following embodiments, which merely represent some of the possible implementations of the invention.

Figure 1:
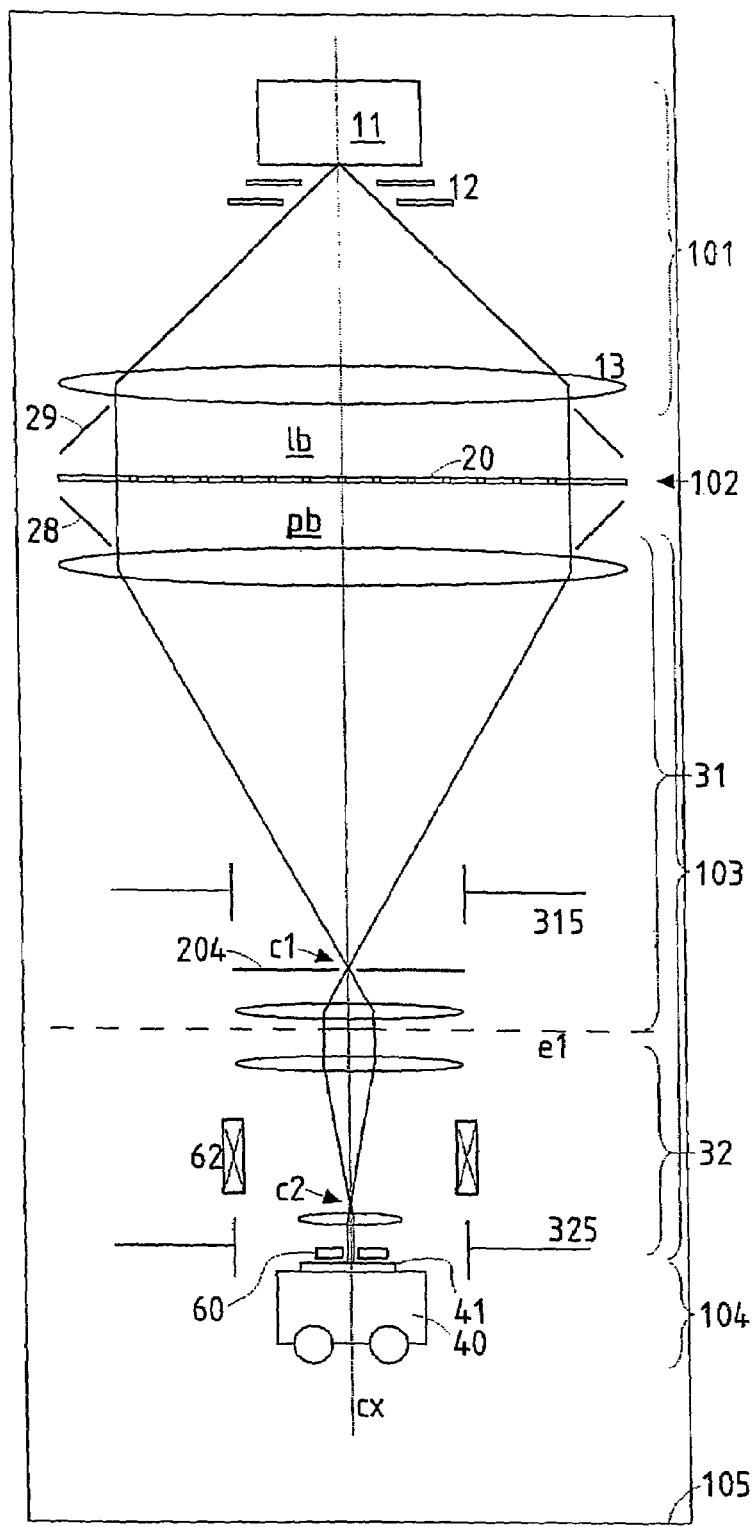
FIG. 1 in a longitudinal section a layout of a lithography apparatus to which the invention applies.

An overview of a processing apparatus employing the preferred embodiment of the invention is shown in FIG. 1. In the following, only those details are given as needed to disclose the invention; for the sake of clarity, the components are not shown to size in FIG. 1. The main components of the apparatus 100 are—corresponding to the direction of the lithography beam lb, pb which in this example runs vertically downward in FIG. 1—an illumination system 101, a PD system 102, a projecting system 103, and a target station 104 with the substrate 41. The whole apparatus 100 is contained in a vacuum housing 105 held at high vacuum to ensure an unimpeded propagation of the beam lb, pb along the optical axis cx of the apparatus. The particle-optical systems 101, 103 are realized using electrostatic or electromagnetic lenses.

The illumination system comprises, for instance, an electron gun 11, an extraction system 12 as well as a condenser lens system 13. It should, however, be noted that in place of electrons, in general, other electrically charged particles can be used as well. Apart from electrons these can be, for instance, hydrogen ions, heavier ions, charged molecules or clusters, the choice of projectile depending on the desired beam-substrate interaction.

The extraction system 12 accelerates the particles to a defined energy of typically several keV, e.g. 10 keV. By means of a condenser lens system 13, the particles emitted from the source 11 are formed into a wide, substantially telecentric particle beam serving as lithography beam lb. The lithography beam lb then irradiates a PD device 20 which, together with the devices needed to keep its position, form the PD system 102. The PD device 20 is held at a specific position in the path of the lithography beam lb, which thus irradiates a plurality of apertures 21 (see FIG. 2). Some of the apertures are "switched on" or "open" so as to be transparent to the incident beam in the sense that they allow the portion of the beam (beamlet) that is transmitted through it to reach the target; the other apertures are "switched off" or "closed", i.e. the corresponding beamlets cannot reach the target, and thus these apertures are effectively non-transparent (opaque) to the beam. The pattern of switched-on apertures is chosen according to the pattern to be exposed on the substrate, as these apertures are the only portions of the PD device transparent to the beam lb, which is thus formed into a patterned beam pb emerging from the apertures (in FIG. 1, below the device 20). The temperature distribution over the PD device 20 is kept stable by appropriate heating or cooling elements, with optional means 28, 29 for irradiation cooling in addition to thermally conductive cooling.

The pattern as represented by the patterned beam pb is then projected by means of an electro-magneto-optical or purely electro-optical projection system 103 onto the substrate 41 where it forms an image of the switched-on mask apertures 21. The projection system 103 implements a demagnification of, for instance, 200× with two crossovers c1, c2. The substrate 41 is, for instance, a silicon wafer covered with a photo-resist layer. The wafer 41 is held and positioned by a wafer stage 40 of the target station 104.

The apparatus 100 may further comprise an alignment system 60, which allows to stabilize the position of the image of the mask apertures (image field mf, FIG. 3) on the substrate with respect to the particle-optical system by means of reference beams which are formed in the PD system by reference marks 26 at the side of the PD field pf (FIG. 2); the principles of an alignment system are described in the U.S. Pat. No. 4,967,088. For instance, correction of image position and distortion can be done by means of a multipole electrode 315, 325; additionally, a magnetic coil 62 can be used to generate a rotation of the pattern in the substrate plane.

In the embodiment of the invention shown in FIG. 1, the projection system 103 is composed of two consecutive electro-magneto-optical projector stages 31, 32. The lenses used to realize the projectors 31, 32 are shown in FIG. 1 in symbolic form only, as technical realizations of particle imaging systems are well known in the prior art, such as, for instance, the U.S. Pat. No. 4,985,634 (=EP 0 344 646) of the applicant (assignee). The first projector stage 31 images the plane of the apertures of the device 20 into an intermediate plane e1 which in turn is imaged onto the substrate surface by means of the second projector stage 32. Both stages 31, 32 employ a demagnifying imaging through crossovers c1, c2. The demagnification factor for both stages is chosen such that an overall demagnification of several hundred results, e.g. 200×. A demagnification of this order is in particular suitable with a lithography setup, in order to alleviate problems of miniaturization in the PD device. A stop plate 204 is provided at, for instance, the position of a crossover c1, in order to block out beam components which are deflected off the regular beam path.

In both projector stages the respective lens system is well compensated with respect to chromatic and geometric aberrations; furthermore, a residual chromatic aberration of the first stage 31 can be compensated by suitable fine correction of the electrode potentials in the second stage 32.

As a means to shift the image laterally as a whole, i.e. along a direction perpendicular to the optical axis cx, deflection means 315, 325 are provided in one or both of the projector stages. The deflection means can be realized as, for instance, a multipole electrode system which is either positioned near to the crossover, as shown in FIG. 1 with the first stage deflection means 315, or after the final lens of the respective projector, as is the case with the second stage deflection means 325 in FIG. 1. In this apparatus, a multipole electrode is used as deflection means both for shifting the image in relation to the stage motion and for correction of the imaging system in conjunction with the alignment system. These deflection means 315, 325 are not to be confused with any additional deflection array means that may be present within the PD device which are primarily intended for correction of individual beamlets (Austrian patent application A 1711/2003 of the applicant/assignee).

FIG. 2 shows a plan view of the (basic) arrangement of apertures in the PD device 20. A plurality of square-shaped apertures 21 is provided which are arranged within a PD field pf in, basically, a regular array in which the apertures 21 are aligned along adjacent lines pl, wherein in each of the lines pl the same number of apertures is present. Seen along the direction perpendicular to the lines pl, the apertures form a sequence of rows r1, r2, r3; in the embodiment shown, the rows r1-r3 are not adjacent but spaced apart. The apertures are arranged in the PD field pf according to a skewed regular arrangement described in detail further below. The arrangement of the apertures according to the invention is a variation of a basic grid an example of which is depicted in FIG. 2.

According to the basic arrangement, the apertures of every n-th row align (in FIG. 2, n=3) as the pitch pn between neighboring rows is n times the width w of an aperture, i.e., pn=n×w. The offset pm between neighboring rows is m times the width of an aperture, pm=m×w (the specific arrangement of FIG. 2 has m=4), and within a line pl, the offset of apertures is n·pm=n×m×w (in FIG. 2, n×m=12). Thus, the apertures cover only 1/(n×m) of the area of the field pf and, at a time, only one out of n×m image elements can be exposed as shown in FIG. 3; the other elements are exposed in subsequent steps by means of moving the substrate along the "scanning direction" sd relative to the image of the apertures. For details about spatial arrangement and circuitry to control the apertures, the reader is referred to the U.S. Pat. No. 6,768,125.

FIG. 3 illustrates the image field mf produced on the substrate; for the sake of clarity it is assumed that all apertures are switched on in this figure. The width fw of the image field is the width L of the PD field pf reduced by the demagnification factor of the projection system. The image field is composed of a plurality of image elements mx (also referred to as pixels). For a given position of the image field on the substrate, each of the apertures 21 of the aperture array corresponds to an image element mx, but as the apertures only cover a fraction of the PD field area, only a corresponding fraction of the number of image elements (shown hatched in FIG. 3) can be exposed at a time. In order to expose also the other image elements, the substrate is moved under the beam so as to shift the image field on the substrate. It will be clear that any alternative way may be used for effecting a relative motion of the image over the substrate; for instance, in one suitable way for nano-scale beam patterning with a stable substrate position, the beam is deflected over the substrate. FIG. 3a illustrates the exposure of pixels in subsequent positions of the motion of the substrate through the possible positions for the case n×m=3×4=12; the pixels are accordingly referenced with letters a to l (the pixels shown hatched are position a). The whole image field mf is moved over the surface of the photoresist-covered wafer serving as substrate 41 so as to cover the total area of the substrate surface. The scanning direction sd may also reversed when one sequence of die fields is finished and imaging of the next sequence begins (boustrophedonal motion as in FIG. 4 of U.S. Pat. No. 6,768,125).

Figure 4:
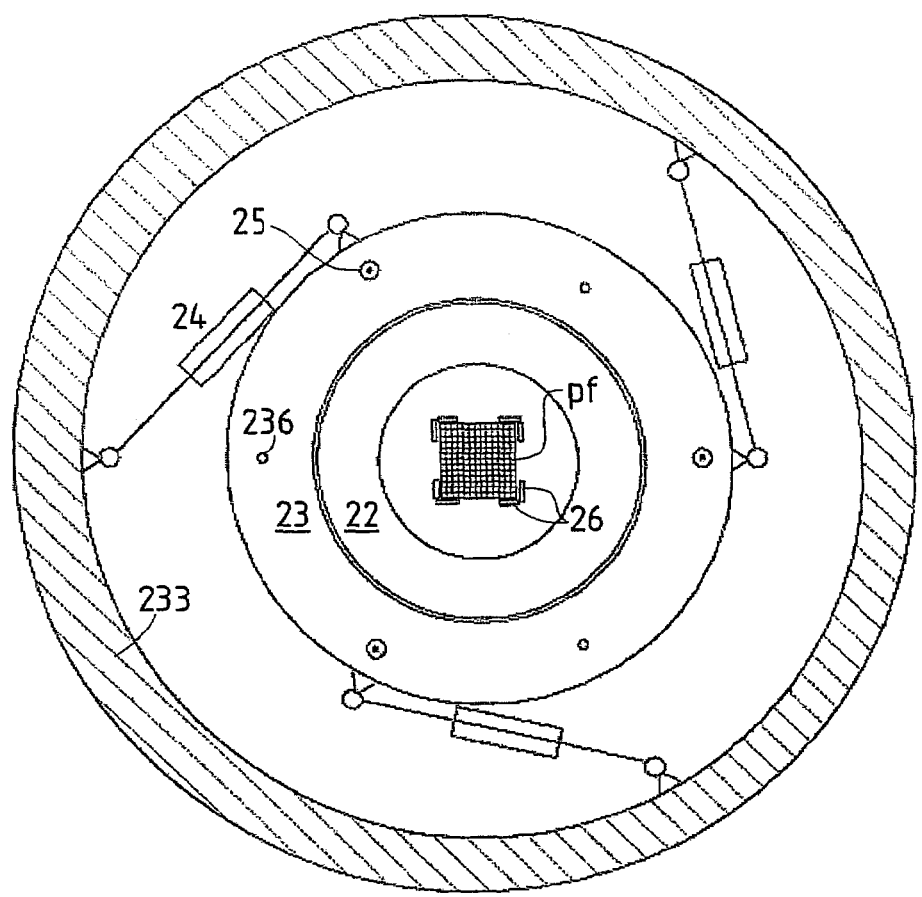
FIGS. 4 and 5 the PD device of the lithography apparatus of FIG. 1 in a top view (FIG. 4) and a longitudinal section (FIG. 5)
Figure 5:
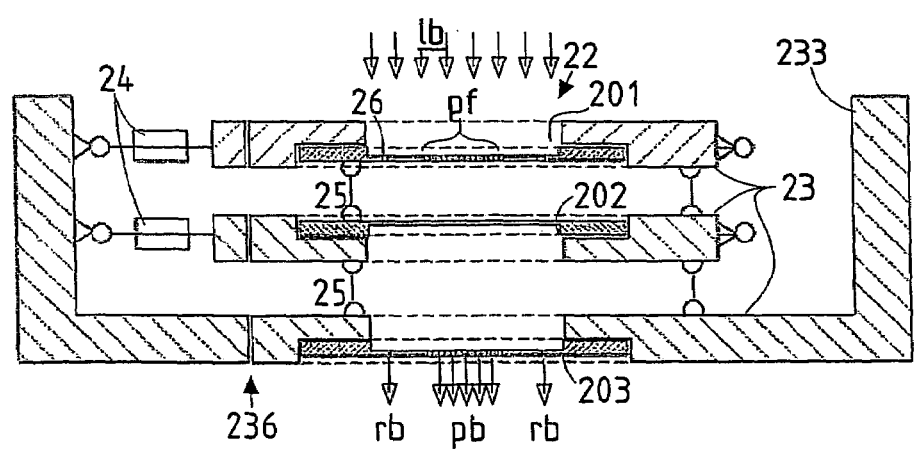
Figure 6:
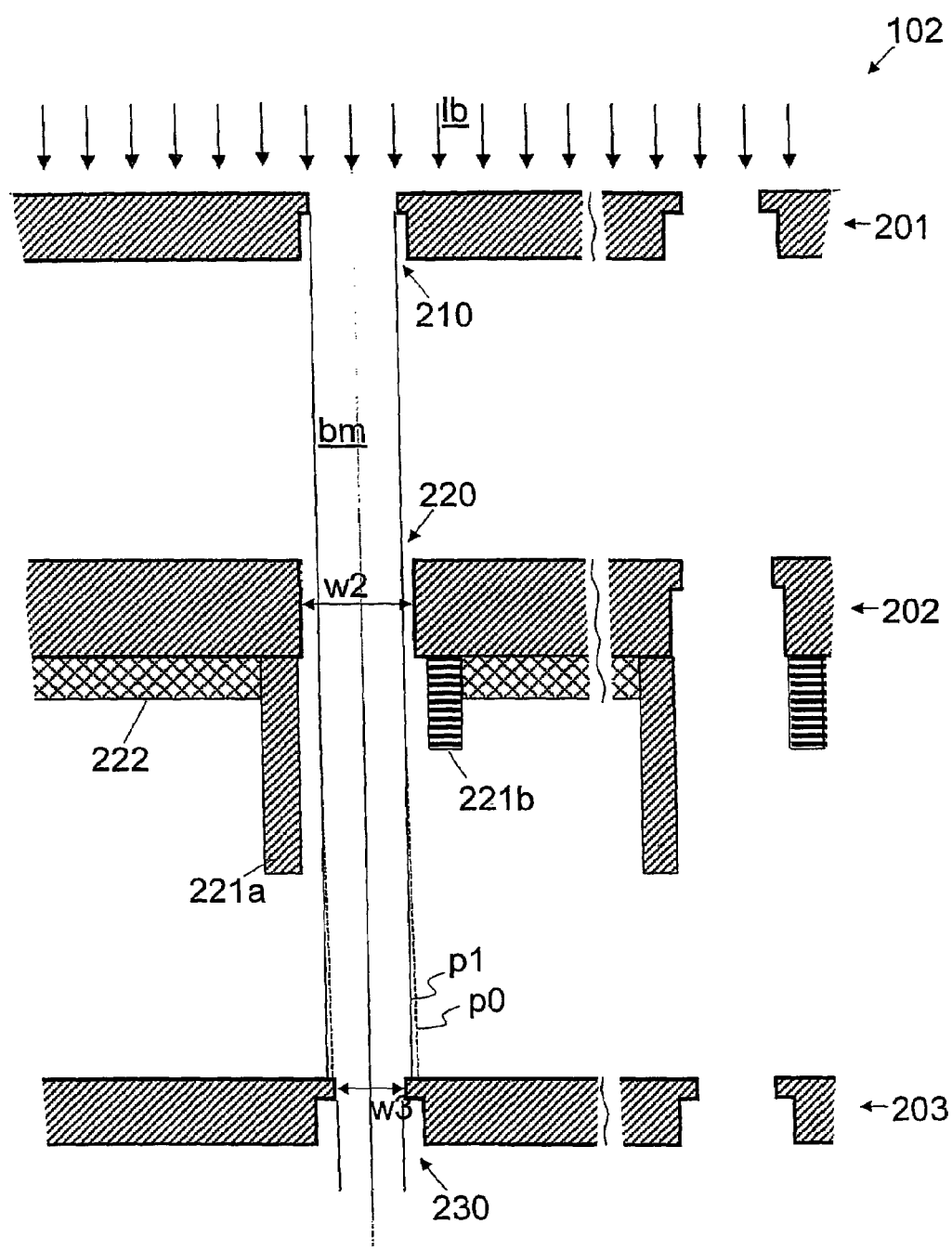
FIG. 6 a detail of FIG. 5 along two apertures.

FIGS. 4 and 5 show the architecture of the PD system 102, namely, in FIG. 4 a top view and in FIG. 5 a longitudinal-sectional view. FIG. 6 shows a detail of FIG. 5, illustrating the configuration of the set of plates constituting the PD system 102 of the present embodiment along two apertures. The PD system 102 comprises a number of plates 22 mounted in a stacked configuration, realizing a composite device whose components serve respective functions. Each of the plates 22 is realized as a semiconductor (in particular silicon) wafer in which the structures were formed by micro-structuring techniques known in the art. The lithography beam traverses the plates through an array of apertures in the PD field pf (FIG. 5). Each aperture corresponds to a set of openings 210, 220, 230 which are defined in the plates 22 (FIG. 6).

The thickness of each of the plates 22 is about 500 µm to 50 µm in the area of the apertures; their mutual distance is in the order of 10 µm to 1 mm. It should be noted that in FIGS. 5 and 6, the dimensions in the longitudinal axis (z-axis parallel to the optical axis of the apparatus) are enlarged and not to scale.

The blanking of the beamlets is controlled by means of a blanking means realized as a blanking plate 202 which comprises an array of openings 220 ("blanking openings"), each corresponding to an aperture. Each blanking opening 220 comprises a set of beam blanking electrodes 221 as well as the circuitry 222 for controlling the electrodes 221a,221b, which are accommodated, for instance, on the lower surface layer of the blanking plate 202. The blanking electrodes 221, serving as aperture deflection plates as described below, are formed around the blanking openings by perpendicular growth employing state-of-the-art techniques. In order to provide a better shielding of the blanking openings against cross-talking and other unwanted effects, one of the electrodes 221a may be formed so as to have a substantial height over the blanking plate 202. Preferably, this electrode 221a is connected with a uniform potential (e.g., ground potential) for all apertures, while to the other electrode 221b the controlling potential for switching between the 'on' and 'off' states is applied. Further details about the layout of the blanking plate 202 and its circuitry 222 can be found in the U.S. Pat. No. 6,768,125.

The PD system 102 further comprises an aperture array means which serves to define the shape of the beamlets laterally and which is here realized as an aperture array plate 203 (in the following in short 'aperture plate') with an array of openings having a width w3, positioned after the cover and blanking plates 201, 202. More details about the layout of the aperture plate 203 can be found in the U.S. Pat. No. 6,768,125.

Figure 18:
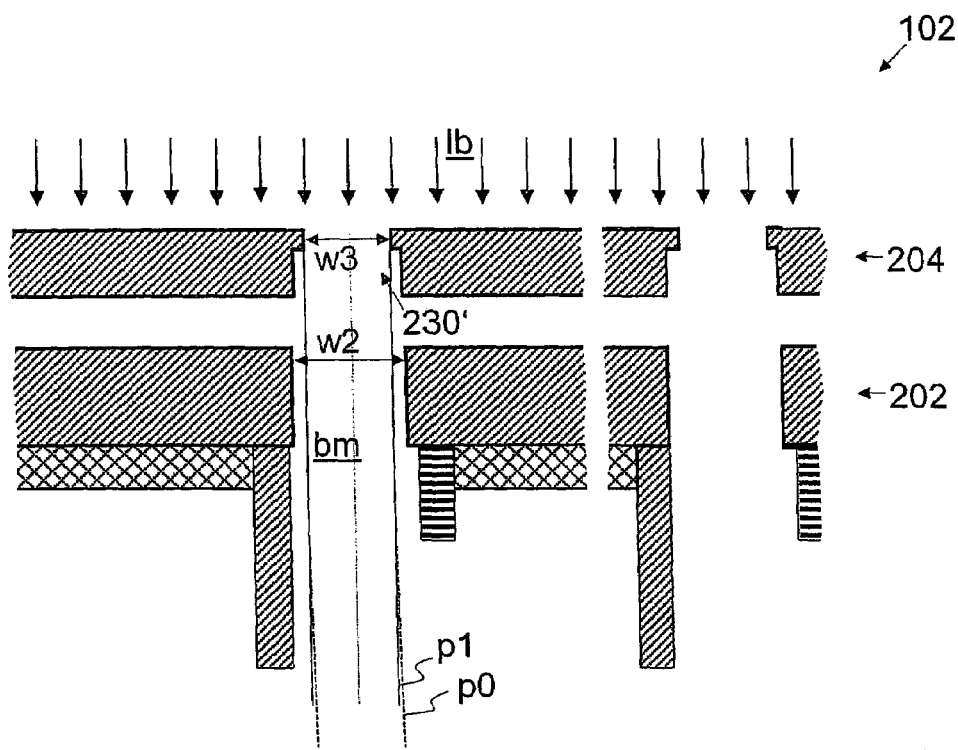
FIG. 18 two variant PD devices in a detail like FIG. 6.

Preferably, the sequence of the functional plates, the cover plate, the blanking plate and the aperture plate, is chosen in a way that plate-to-plate alignment as well as heating, charging and contamination effects inside and between the plates of the PD system can be controlled easily. The arrangement shown in FIG. 6, in which the cover plate is positioned on top, the blanking plate in the middle and the aperture plate at the bottom as seen from the direction of the incoming beam, is just one possible arrangement. Other possibilities might be an arrangement of a PD device 102' shown in FIG. 18 where the aperture plate is combined with the function of the cover plate to a "beam forming plate" 204 which is positioned above the blanking plate 203, or the beam forming plate is bonded directly on the blanking plate. In this case, the beamlet bm is defined upon passing the aperture 230' with the appropriate width w3.

Figure 18A:
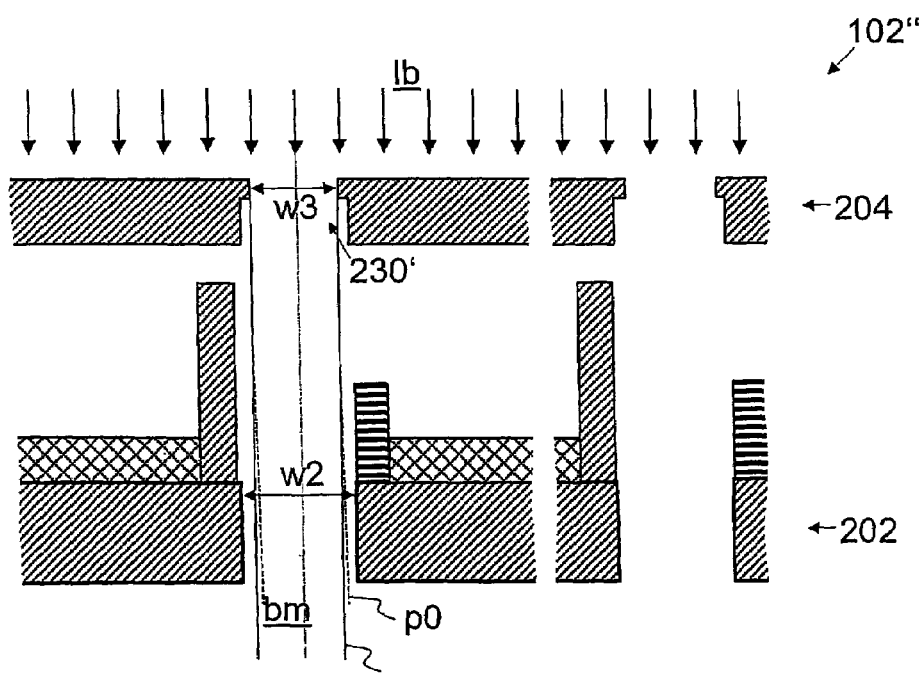

FIG. 18a shows the option of another variant of the PD device 102" with a two plate system where the blanking electrodes are placed in the space between the aperture plates. The beam deflection angles for blanking are generally very small, typically 0.5 to 5 thousands of a radian, so that the distance between the deflected beam and the side wall of the apertures is sufficient. One important advantage of variant 102' is that it enables a PD device consisting of only two plates, where both the upper and the lower plate can be used as part of a "diverging lens" (cf. U.S. Pat. No. 5,801, 388 and U.S. Pat. No. 6,326,632 of the applicant/assignee). This advantage is made possible by placing the blanking electrodes between the plates, so that the electrodes of high aspect ratio do not lead to a deformation of the electric field gradient outside the interstitial space between the two plates which is applied to realize the diverging lens. Further, an important advantage of variant 102' is offered by choosing a small distance between the plates to efficiently reduce cross-talk related limitations of the PD device (e.g. 10 µm between the upper side of the longer electrodes used as shielding electrodes and the beam forming plate above). A small distance can be achieved for example by stacking the two aperture plates using appropriate spacing elements.

In front of the aperture and blanking plates 202,203, as seen in the direction of the lithography beam, a cover means realized as a cover plate 201 is provided in order to protect the other plates from irradiation damage. The cover plate 201 takes up the majority of the impingent lithography beam lb; the particles can only pass through the openings 210, formed in an array corresponding to that of the blanking plate, which openings make up only a small fraction of the total area of the blanking field bf. More details about the layout of the cover plate 201 can be found in the U.S. Pat. No. 6,768,125.

It is the aperture 230 of width w3 (rather than the initial opening in the cover plate 201) which defines the lateral shape of the beamlet emerging from the system 102 (corresponding to the width w of an aperture in FIG. 2). Therefore, strictly speaking the term 'apertures' should be reserved to the openings of defined shape and width w (FIG. 2) as defined by the beamlet-defining apertures 230, in contrast to 'opening' which is used as generic term; however, the term 'aperture' is also used to denote the set of corresponding openings 210,230,220 through which one beamlet bm propagates, as in FIG. 6.

The width w2 of the blanking opening 220 is greater than the width w1 of the opening 210 in the cover plate 201, so the beamlet bm defined by the latter opening will pass through the former opening without affecting the controlling circuitry 222 on the blanking plate 202. For instance, the width w2 can be 7 μm (as compared to the defining width of the aperture of w=5 μm).

The beamlet bm transgresses the subsequent openings of the plates 22 along the path p1 and is then imaged in the imaging system (FIG. 1), provided the blanking electrodes 221a,221b are not energized; this corresponds to the "switched-on" state of the aperture (with respect to the switching state, no distinction is made between the blanking opening, the respectively associated aperture or beamlet defined by that aperture). A "switched-off" aperture is realized by energizing the electrodes 221a,221b applying a transverse voltage. In this state, the blanking electrodes 221a,221b deflect the beamlet bm off the path p1 to a deviating path p0 so the beamlet will be absorbed, for instance at the stop plate 204 (FIG. 1) positioned at some place after the PD device.

It should be appreciated that the beamlet bm will be deflected in the switched-off state by an angle which will be rather small, and the beamlet may still pass through the aperture 230 as shown in FIG. 6; however, the deflection caused by this angle is sufficient to bring about a lateral deviation of the angel at a later position that it is easy to block off the ("switched-off") beamlet.

Referring again to FIGS. 4 and 5, the plates 22 are held by chucks 23 which are positioned with respect to each other by means of actuators 24,25 realized as piezoactuators or nanopositioning elements of known type. The vertical actuators 25 may also be left off in order to save space; then the positioning between the plates is defined by the height of the chucks 23 themselves which then are simply stacked on each other. One of the chucks, in FIG. 5 for instance the chuck of the last plate, may be formed as a cup 233 so as to facilitate lateral positioning of the other chucks. Preferably, the plates 22 and chucks 23 are produced from the same material, e.g. silicon, or materials having the same thermal expansion behavior in the operating temperature range. The chucks also provide for the electric supply of the blanking plate 202; for the sake of clarity, the electric lines are not shown in the figures.

In the plates 22 openings 26 are provided for the definition of reference beams rb. The shape of the reference beams rb is defined, for instance, in the opening formed in the aperture plate 203, whereas the corresponding openings in the other plates are wide enough so as to let pass the radiation for the reference beams rb. The reference beams rb and the patterned beam pb are then imaged towards the substrate plane; in contrast to the patterned beam pb, however, the reference beams rb do not reach the substrate 41 but are measured in the alignment system 60 as already mentioned above. The chucks 23 further have alignment openings 236 which serve as alignment markers for relative positioning of the chucks 23 and the plates 22 they hold.

Interlocking Grids

According to the state-of-the-art layout discussed above, a regular grid is formed by spots with a certain spotsize and the spot distance is equal to this spotsize in both directions (FIGS. 2 and 3). The positions of apertures according to such a regular imaginary grid are referred to as basic grid in the following.

According to the invention, the apertures are arranged along "interlocking grids" in order to create additional exposure spots on the substrate which are interpolated between the positions of spots of the basic grid. Some apertures are shifted (offset) with respect to the basic grid in horizontal and vertical direction by a fraction of the effective aperture width, in particular $½^N$ (N is a positive integer, preferably $N \geq 2$) of the diameter for square or rectangular grids.

In the following, the invention is described in the context of an arrangement of apertures realized on a basic grid of n=5 and m=6 (i.e., n×m=30). The minimum feature size to be illuminated on the wafer is 45 nm (referred as 45 nm node with 45 nm resolved lines and spaces), and the spot size is 25 nm (pixel width x in FIG. 3, equaling geometric image size of one aperture). The image field width fw is 24 μm; in order to produce this image field in connection with a 200× demagnification projection system (see above), the square-shaped PD field has a width L=4.8 mm, corresponding to a number of lines pl=L/w=960, and 960 bit streams are to be addressed by the incoming data stream. In the direction across, there are fw/(n·x)=L/(n·w)=192 apertures in each of the rows r1-r3.

Figure 7:
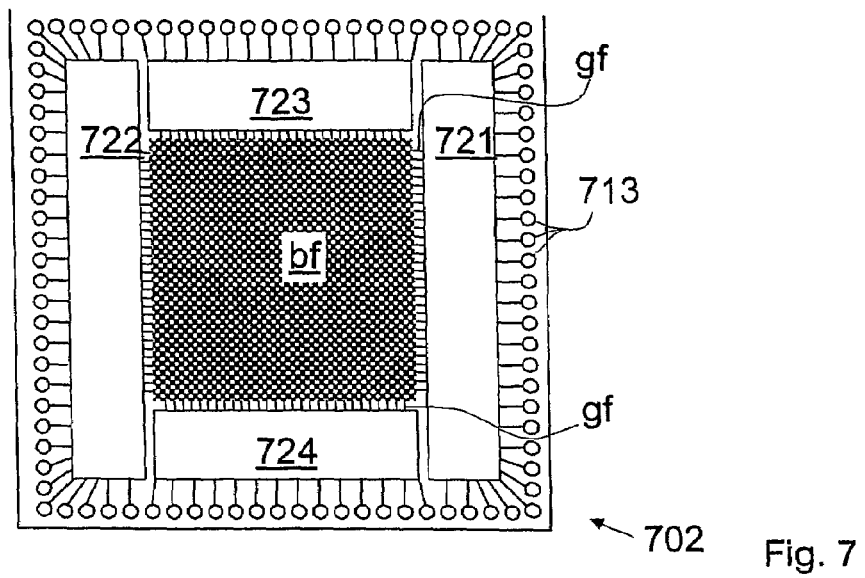
FIG. 7 a plan view of the blanking plate according to a preferred embodiment of the invention.

As already pointed out, the blanking plate has an array of blanking openings, hereinafter called the blanking field bf, which reflects the arrangement of apertures in the aperture field in direct correspondence. One suitable embodiment of a blanking plate 702 according to the invention is shown in the plan view of FIG. 7 (the other plates of a PD device, such as the cover and aperture plates, would have to be dismounted to reveal this view). In the center of the blanking plate 702, the blanking field bf can be found. Like with the arrangement of apertures, there are 960 lines having 192 blanking openings each in the blanking field bf. Since this arrangement of openings cannot be represented to scale, the field bf is represented with a cross-hatching only in FIG. 7. At the periphery of the blanking plate 702, the data stream of the pattern to be produced is fed in via a number of pad connections 713. Since due to necessary size of the pad connections their number is limited, the pattern signal is multiplexed to a smaller data width at a higher data rate, with the data width corresponding to the number of pad connections. Converter means 721, 722, 723, 724, which are preferable positioned surrounding the field bf, decode the data to the control signals which are applied to the blanking openings in the field bf. These signals are applied using a number of feeding lines 711 (only a part of the feeding lines are shown in the figure for sake of clarity; actually, there are 960 feeding lines 711 plus several control signal lines, as explained below).

Figure 8:
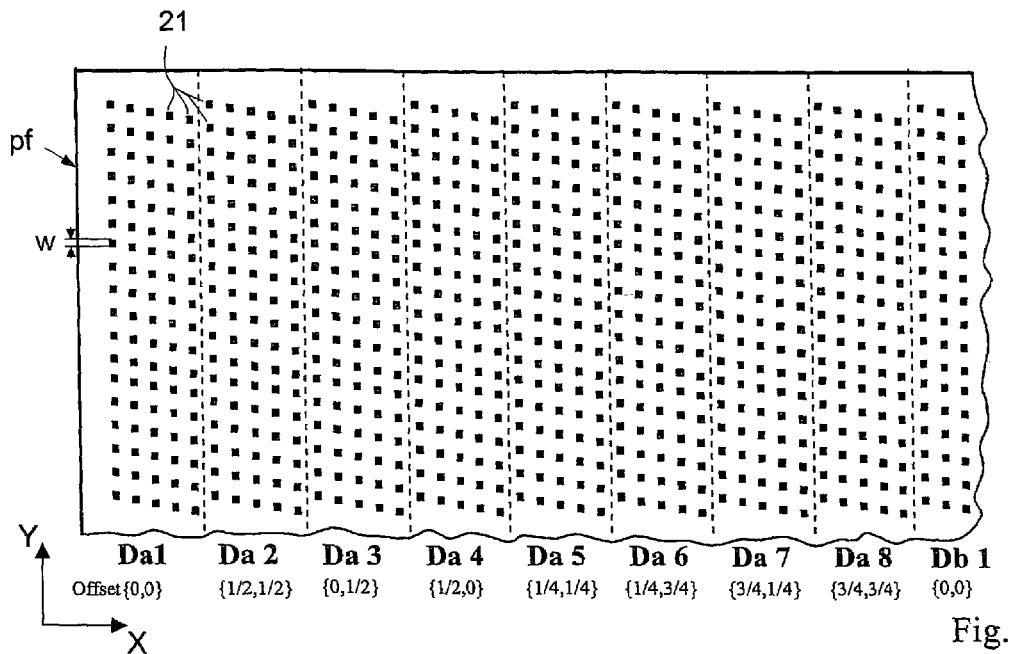
FIG. 8 the arrangement of apertures according to the preferred embodiment.

FIG. 8 shows the upper left edge of the aperture field pf. In the embodiment shown, the first n=5 rows (as seen from the left) are aligned so as to cover the whole width of the aperture field (running vertically in FIG. 8), and thus form a first set Da1. The next set Da2 of n=5 rows are offset by one half of the diagonal of the square of an aperture with regard to the basic grid defined by the first set. The third set Da3 of rows is offset by one half of the aperture width along the Y direction from the basic-grid position; the fourth set Da4 by one half of the aperture width along the X direction. The next four sets Da5, Da6, Da7, Da8 are offset by multiples of a quarter of aperture width along the X and Y directions as denoted in FIG. 8. Each of the sets Da1-Da8 thus forms a "domain" of apertures representing one of eight interlocking grids. Following the eighth set Da8, another set Db1 aligning with the first set Da1 is realized, starting a new sequence of domains.

Figure 9:
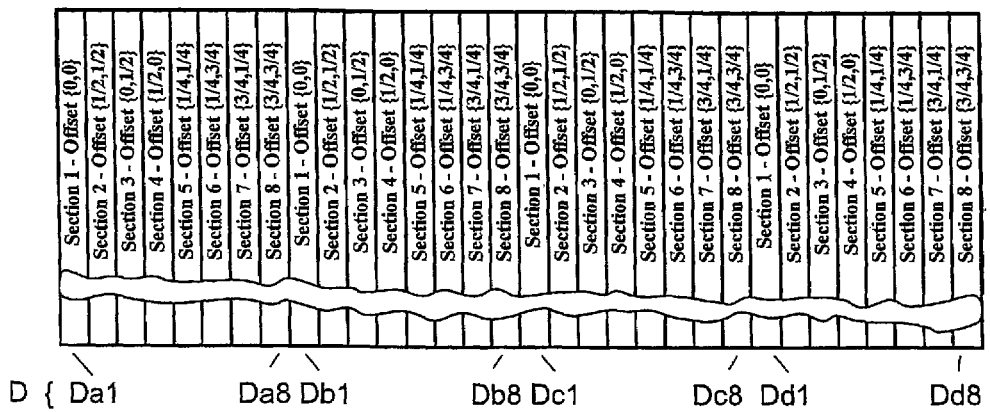
FIG. 9 the overall layout of domains of interlocking grids concept of the invention.

FIG. 9 shows the way the aperture field pf is segmented into such domains D. The sequence of domains Da1 through Da8 is repeated three times, resulting in a total of thirty-two domains Da1-Da8, Db1-Db8, Dc1-Dc8, Dd1-Dd8. Domains denoted with identical digits represent the same grid, while the grids of domains with different digits are offset to each other, they are interlocking with respect to each other.

FIG. 10 shows a detail of the aperture arrangement in the first two domains Da1, Da2, and FIG. 11 a like detail of a border region between the second and third domains Da2, Da3. The arrangement of apertures which would be present if the arrangement of domain Da1 were continued into the consecutive domains Da2, Da3 is shown as hatched squares. The detail of FIG. 10a shows that the apertures of the domain Da2 are offset by one half of the aperture size along the diagonal, i.e., by $\{½, ½\}$ of the basic grid. The detail of FIG. 11a shows the offset of the apertures corresponding to $\{½, 0\}$ with respect to the basic grid.

Figure 12:
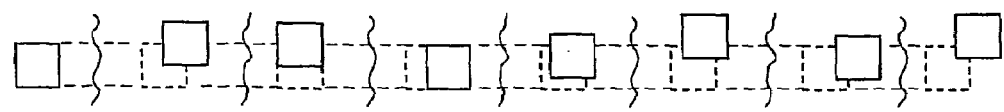
FIG. 12 the fractional offsets of the eight domains of FIG. 9.

FIG. 12 shows a graphical survey of the fractional offsets of the domains Da1-Da8 using a sequence of details like that of FIGS. 10a and 11a.

In the embodiment underlying FIGS. 8-12, the number of domains with different grids is eight, realizing multiple interlocking grids with fractional offsets that are multiples of ¼ of the aperture width. In general, the number of domains and the fractional offsets can be chosen freely as suitable for the individual application; preferably there are $2^{2N-1}$ domains realizing fractional offsets equal to multiples of the binary inverses, $½^N$ (with the sum of the X and Y offsets equal to an even multiple of $½^N$).

Interlocking arrays allow spatial pixel interpolations, and hence an improved flexibility with respect to image placement and line edge roughness. Moreover, the required number of gray levels (see below) for a pre-defined address grid may be significantly reduced. Interlocking grids can be used to interpolate an existing pixel representation, for example, to reduce the required number of gray levels—which may be important when down-scaling of the PD field is desired—or to improve resolution by using a smaller address grid which is important to define intricate structures such as the structures of transistor gates. The necessary data pre-calculation, such as for example the calculation of a linear interpolation interlocking grid for a given gray pixel data, can be done during operation of the structuring process or off-line beforehand.

It is recalled that the need for a gray scaling in direct-write lithography comes from the situation that semiconductor industry design rules imply smaller and smaller address grids in order to match the specifications with respect to image placement and line edge roughness. For example, using a geometric spot size of 25 nm with about 22.5 nm blur and an address grid with 25 nm pitch, simulations show that 46 gray levels are sufficient to place the features with the required precision of 1 nm on the wafer (meaning a line-position error below 0.5 nm and a line-width error below 0.5 nm at all grid positions). Additionally, to meet lithography specifications the total line width variation has to be less than about 10% of the critical dimension (=nominal minimum line width), which means that the single side line edge roughness has to be less than 5% of line width. It is remarked that the line edge roughness is a measure for the linearity of lines, expressed by the deviation of a straight line of the level curve of the total dose distribution at the exposed wafer (aerial image) after cutting off at the threshold dose.

The main advantages of gray pixels arranged in multiple interlocking grids are:
1) It is possible to place a line with 45 nm and 32 nm line-width with a required precision of 1 nm (virtual grid) on the wafer (calculations were made with 25 nm spots, 22.5 nm blur, 14% background and 16 gray levels).
2) The process latitude is nearly independent from the background dose.
3) The process latitude is increased (if a 45 nm line is written with 25 nm spots, 22.5 nm blur, 14% background and 16 gray levels, the process latitude is in the range of 15% and for a 32 nm line—with the same parameters—about 10%).
4) The process latitude is nearly independent from the line position.
5) The process latitude is not decreased in the corners.
6) The total line-width variation is less than about 0.7% of the critical dimension (=nominal minimum line-width) for a 45 nm line and lower than 1.86% for a 32 nm line.

The main advantage of the multiple interlocking grids is an increased process latitude with a certain spotsize and blur. Simulations made by the applicant (assignee) proved that the dose latitude is nearly linear scaling with the spotsize, therefore all spotsizes can be interpolated linearly between 50-77%.

Gray Scales

The term gray scale refers to the possibility of irradiation of the pixels at the target at exposure levels whose values are not only a minimal ('black') or a maximal ('white') exposure dose, but also intermediate levels. A composite approach for addressing gray values is employed whose principles were outlined in the U.S. Pat. No. 6,768,125 and are here adapted for the multiple interlocking grids, namely (i) gray scaling by superposition, namely by irradiation of the same pixel through a plurality of apertures that are operated at different 'transparency', i.e. deflection states, and (ii) gray scaling by fractional irradiation, namely by switching on apertures during a fraction of the individual irradiation cycles only.

As already mentioned every eighth domain has the same grids, so the apertures of these domains—for instance, domains Da1, Db1, Dc1 and Dd1—cover the same pixels on the target substrate in the course of scanning motion. This can be used to produce a gray scale by superposition, in this case a scale between 0 to 4, depending on how many of the respectively corresponding apertures in the four domains are switched on.

A finer gray scale is achieved by implementation of fractional irradiation during an irradiation cycle. For this, each blanking opening is controlled with regard to its deflection state by a blanking signal comprising more than one bit. For instance, the blanking signal may comprise three bits which allows $2^3=8$ values of gray shadings for a single irradiation cycle. For example, if the three bits form a binary signal 101 (equivalent to a decimal number 5), the corresponding aperture is switched on for ⅝ of the irradiation cycle. In general, the blanking signal will comprise p components, p>1, allowing for up to $2^p$ gray shadings assuming a binary signaling.

Thus, each irradiation cycle may be split into a sequence of up to $2^p$ split cycles. The scanning motion may be halted during a whole irradiation cycle, or only for each of the split cycles. In the latter case, the optical system (in particular the deflection means 315, 325; see FIG. 1) may be used to shift the image laterally on the target so as to adjust with the factual motion of the target 41 on the target station 104.

In this context it should be mentioned that in a variant, the X offsets of the domains may be all chosen as 0; in this case where fractional X offsets are needed, they may be introduced by appropriate shifts of the image by means of the optical system in the mentioned manner.

Figure 13:
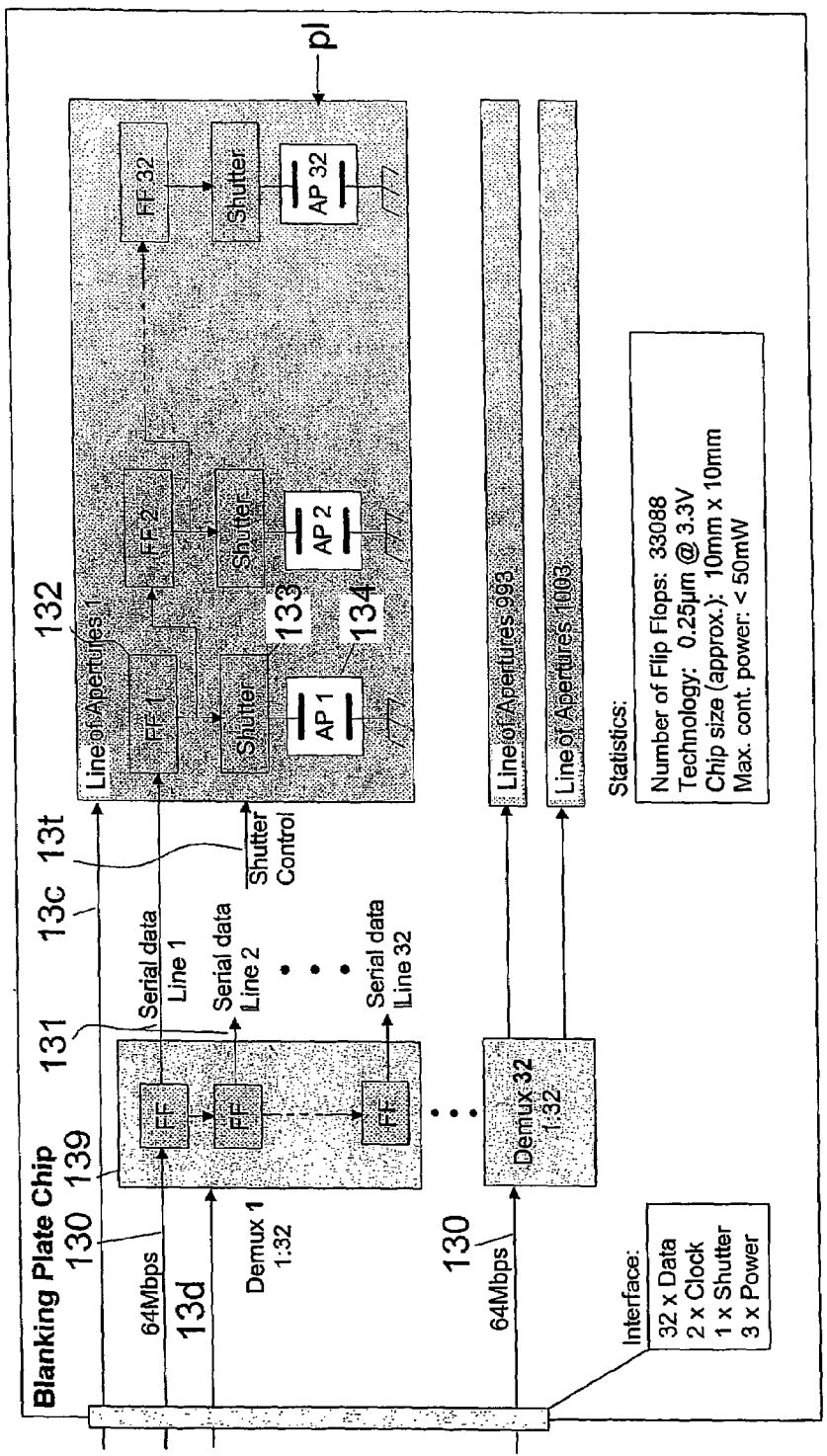
FIG. 13 the processing of blanking signals.

The schematic diagram of FIG. 13 shows the processing of the blanking signals in the blanking plate. The blanking signals are fed in through p-bit lines 131 each of which serves one line pl of blanking openings (called 'Line of Apertures' in FIG. 13), respectively, by providing a sequence of bits. In the example discussed here with 32 blanking openings per line and p=3, a 48-bit sequence is fed in to each blanking signal line 131; only one line of blanking openings is shown in FIG. 13 for clarity. The data are propagated through shift registers 132 (triggered by a common shift-clock signal 13c) and distributed to temporary registers 133 serving as buffers, one p-bit buffer for each blanking opening. Before commencement of an irradiation cycle, the data stored in the p-bit buffers is taken to the blanking circuitry of the blanking openings 134 upon a uniform activation trigger signal 13t.

The data of the blanking signal lines 131 are fed to the chip in which the blanking field bf is realized in form of a small number of data streams (of 64 Mbps for instance) which is demultiplexed to the blanking signal lines 131 by demultiplexers 139 located on the same chip (since the data stream has a much higher clock rate, the demultiplexers are controlled by a clock signal 13d different from the clock signal 13c). For instance, each data stream 130 is demultiplexed to 32 blanking signals 131.

Gray Groups

It should be mentioned that in a variant of the invention (not shown here), handling of the data transfer—in particular if the number of overlaying apertures (blanking openings) is greater than four—could be facilitated by using a gray group strategy with the coding of the gray scales generated by superposition of apertures. To generate a distinct number of exposures, in total adding up to a given intensity, a binary color increment can be used instead of a linear color increment, where for example a 4-bit pixel is build up by 4 gray channels, comprising each $N*2^n$ apertures, with n corresponding to the gray color channel 1 to 4 (or higher), and N the number of the apertures of the lowest (non-zero) gray level. Then, any gray level spanned by the 4-bit range can be expressed by a simple binary number. For example, to create gray values between "0" and "15" a linear independent basis consisting of 'gray groups' comprising 1, 2, 4 and 8 blanking openings respectively may be used.

For instance, gray level "13" is generated by a binary signal (1011), which means, that columns 1, 3 and 4 are active and contribute fractional doses of $\frac{1}{16}$, $\frac{4}{16}$ and $\frac{8}{16}$ to the cumulated exposure dose, whereas column 2 does not contribute at all. The crucial and important advantage of the binary channel approach is that by subdividing the 16 levels into only 4 'gray group' channels, data transfer issues become much simpler as compared to the straightforward strategy used in the U.S. Pat. No. 6,768,125.

Choice of Multiple Interlocking Grids

If each pixel is written with 8 gray levels, every image spot requires information equivalent to 3×8=24 bits (3 bits gray information times the number of domains overlaying at each spot). To reduce the data transfer there are two ways:
1) use less gray levels, and
2) use less grids number.

If the gray level numbers are reduced, it is hard to achieve the required virtual grid of 1 nm.

As becomes already clear from the embodiment shown in FIGS. 8 to 12, the domains need not realize all possible combinations of multiples of the base fractional offset. For instance, a grid with offset {0, ¼} is not realized in that embodiment, as are the other grids where the sum of the X- and Y-offsets is an odd multiple of ¼. Thus only every second of the possible grids is actually realized. In fact it was found that the numbers of grids can be further reduced, for example from 8 to 4, namely the 4 grids with X=Y: {0, 0}, {¼, ¼}, {½, ½}, {¾, ¾}. This reduces the amount of data to be fed into the PD device to a half. Calculations showed that all results of the multiple interlocking grids with 8 domains as in FIG. 8 are reproduced with this reduced set as well. A disadvantage of this grid arrangement is a non-homogenous distribution of the spots.

Example of Sputter Process

Figures 16, 17:
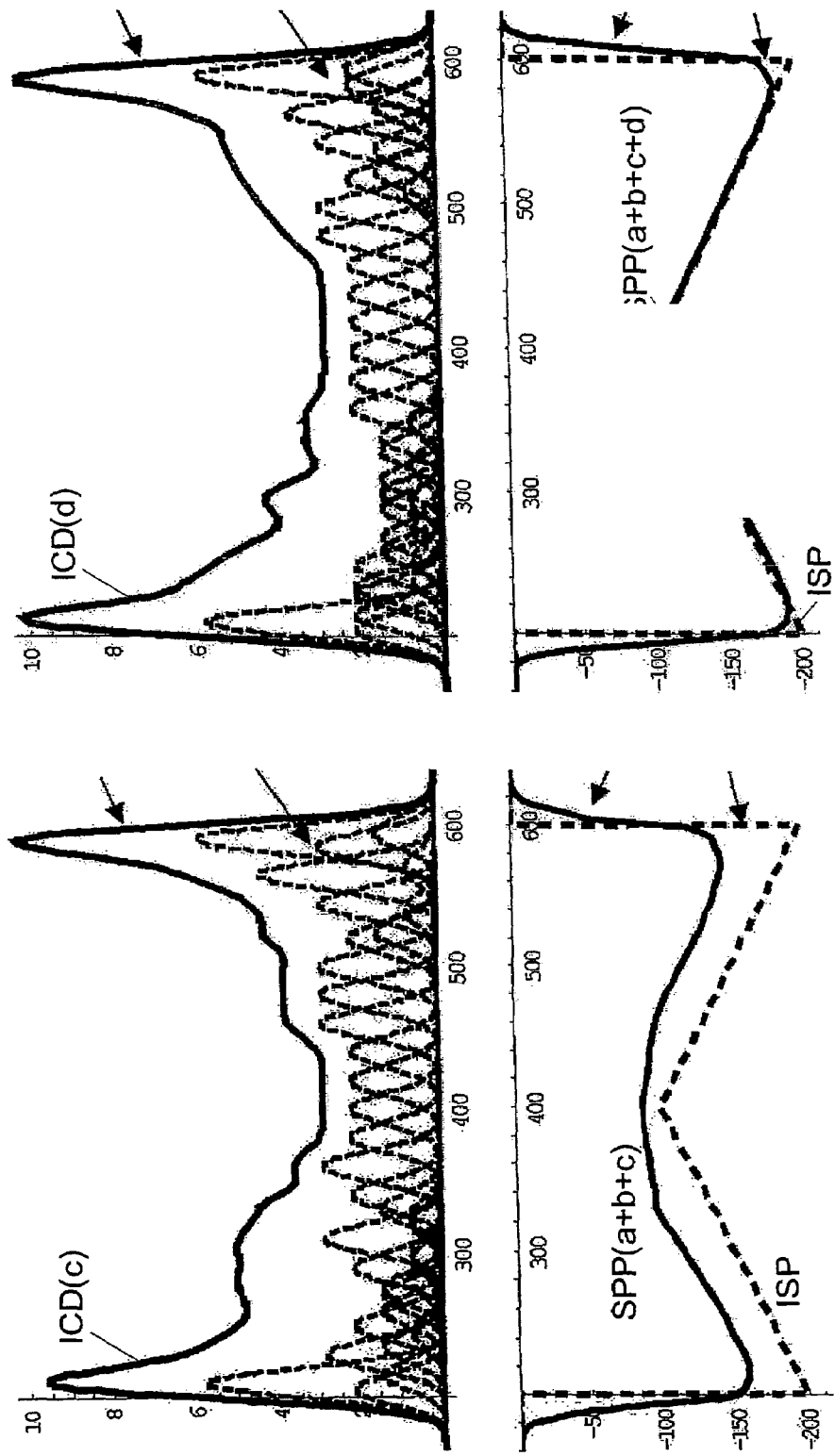

FIGS. 14 to 17 illustrate the progress of a trench-sputter process on a semiconductor substrate used as target. The aim of the sputter process is formation of a long dove-tail trench of 600 nm width and 200 nm depth; the trench is assumed to be straight and uniform along its length. FIG. 14 shows the process after exposition through the apertures of the first sequence Da1-Da8 of domains, FIG. 15 after the second sequence Db1-Db8, FIG. 16 after the third sequence Dc1-Dc8, and FIG. 17 depicts the result of the complete sputtering process, which is the cumulated result of exposition to all four domains. The substrate is a silicon wafer, which is irradiated with argon ions at an energy of 30 keV with a current density of 0.75 mA/cm² of each spot on the substrate; the sputter time is 3.65 s for each of the four sequences.

In each of FIGS. 14 to 17, the upper diagram shows the ion current density ICD, given in mA/cm², across the width of the trench (horizontal coordinate). The dotted lines represent the contributions of each spot which is exposed on the substrate and produced by one aperture in the corresponding line along the X coordinate (parallel to the scanning direction). The sum of these individual contributions is the full line, the total ion current density ICD. All lengths are given in nm. The lower diagram shows the actual profile SPP of the sputtered substrate after irradiation of the respective sequence of domains. These results were obtained by a numerical computer simulation of the sputter process done by the applicant (assignee). (Note that the left side of the trench is at a lateral coordinate of 200 nm.) The dotted line ISP represents an ideal dove-tail shape given for comparison; it represents an ideal result which, however, cannot be reached by any real sputter process.

As can be seen from these drawings, in particular FIG. 17, the invention allows to produce a sputtered surface profile of high quality and smoothness (i.e., the deviation of the profile SPP to the ideal dove-tail shape is lower than 2% of the sputtered pattern). These drawings also illustrate that by virtue of this method, it becomes possible to remove layer by layer off the target substrate in successive steps. With prior-art methods this was not possible since the individual spots were to narrow, resulting in an assemblage of isolated spots on the target rather than a smooth irradiation profile.

The multiple interlocking grids according to the invention in the field of lithography e-beam direct write applications result in the following particular advantages:

For high voltage electron beam lithography, which is suitable to achieve highest resolutions in lithography, in particular when 100 keV electrons are used, an unwanted dose contribution (proximity effect) is caused by electron backscattering from the wafer (i.e., the target). 100 keV backscattered electrons are typically spread out substantially to dimensions of about 30 μm before reaching the resist covered surface. Forward scattering, for comparison, which is dominant at low energies, causes only a minor contribution. To correct for the proximity effect caused by 100 keV electrons, the problem can be turned into one of a smooth background dose correction and is practically independent of the particular feature shape.

For example, backscattering of 100 keV electrons in silicon gives rise to an extra dose of about 14% of the deposited dose (over 30 μm averaged) in the resist if maximum 50% pattern density is assumed. For very low pattern densities, for example in case of isolated lines with no patterns in the neighborhood, backscattering plays no significant role for the total dose.

The effective strategy for proximity correction made possible by the invention is an adjustment of the edge slope and cut-off position of the total dose distribution (=deposited dose plus extra dose due to backscattering) by using interlocking-grid gray level spots with adequate gray levels, yielding the as-designed edge positions at optimized edge slope over the entire address grid.

The described method of interlocking grids allows a very fine address grid (line position, line width) where all features can be realized with practically the same process latitude. In the case of zero background but also in presence of 14% background it is possible to adjust the edge slope of the deposited energy profile and the cut-off position, allowing process latitudes of sufficient quantity over the entire grid independent of the local pattern density.

For common high-contrast resist materials the resolution and process latitude can be derived from the aerial image (spatial distribution of deposited dose). As common for chemically amplified resists, the latent image (i.e. the spatial distribution of exposed and unexposed resist) is proportional to the exponential of the negative intensity of the aerial image. The resulting gamma-like behavior leads to the common (and good) approximation that the feature width and position after the lithographical process can be derived by "cutting off" the aerial image at a certain dose level, usually one half of the maximum dose level. In the examples shown in the following, the dose distribution is cut off at 50% of the average dose level, giving the reader an impression on the achievable width and position of lines after development, using the new possibilities offered by the invention.

Extra Apertures; Defect Correction

In order to take into account for possible defects or other problems in the context of gray scaling, it is possible to include spare blanking openings which can be enabled or disabled depending on the number of defects per line. To provide this option, more apertures than necessary could be structured for some or all channels, or, what seems more useful, an additional "extra aperture" group could be added in each line, so a specific number of apertures per line can be "activated" when needed, for example physically by focused ion beam modification of the corresponding connection lines, or by software controlled switching using implemented logics. Details can be found in the applicant's AT 755/2003 and patent applications derived from it.

Variant Apertures

Figure 19:
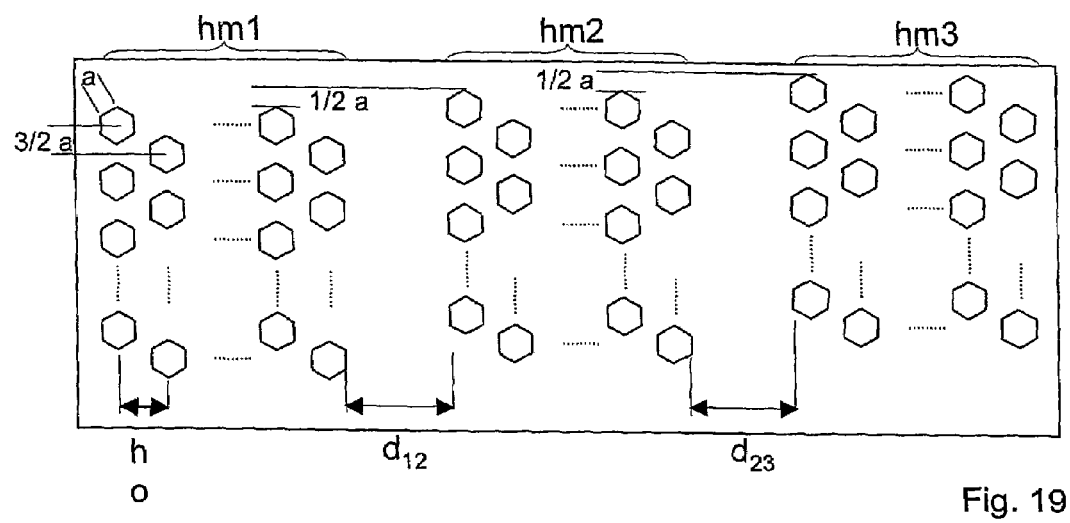
FIG. 19 an interlocking-grid arrangement with hexagonal arrays.
Figure 20:
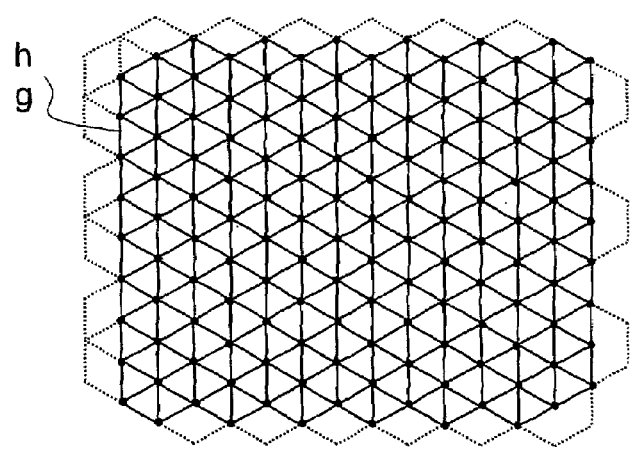
FIG. 20 the address grid on the target resulting from the interlocking hexagonal arrays of FIG. 19.

It is worthwhile to note that there are other ways to realize interlocking grids. One example is shown in FIGS. 19 and 20, namely, an arrangement of hexagonal apertures (or having a shape close to a hexagon, for example circular) in the PD field (FIG. 19) for addressing a triangulated target grid (FIG. 20). The apertures (or blanking openings) are arranged in three domains hm1, hm2, hm3. Within each domain, which may be sub-partitioned in to gray groups according to the above considerations, the apertures are positioned with respect to each other according to an hexagonal array (which may be elongated in the direction of scanning), where neighboring lines are spaced apart by 3/2 of the side length a of an hexagon, and a suitable value for the offset ho of apertures in neighboring lines is ho=(k+½)·a·$\sqrt{3}$, with k≧1 being an integer number. In general, any offset is possible if an appropriate signal phase transformation is provided for the offset lines. The distance between the apertures of different domains, $d_{12}$ and $d_{23}$, may be chosen as equal to the offset ho, or as (k'+½)·a·$\sqrt{3}$, or in general, any offset if an appropriate signal phase transformation is applied to the respective first aperture of the groups belonging to the respective domain. The distances $d_{12}$, $d_{23}$ will usually be equal to each other, but could also take different values. With these values, the hexagonal apertures of FIG. 19 are appropriate for generating a regular distribution according to a triangulated target grid hg shown in FIG. 20. In this figure, the dots represent the physical access grid on the target (centers of exposure dots), and the solid lines show the envelope of the geometric spots of the apertures of all three domains hm1 . . . hm3.

We claim:

1. A pattern definition device (102) for use in a particle-beam processing apparatus (100), said device being adapted to be irradiated with a beam (lp,bp) of electrically charged particles and allow passage of the beam only through a plurality of apertures, said apertures (21,230) of identical shape defining the shape of beamlets (bm) permeating said apertures, wherein the apertures (21) are arranged within a pattern definition field (pf), wherein with said apertures are associated corresponding blanking openings (220) located such that each of the beamlets (bm) traverses that blanking opening which corresponds to the aperture defining the beamlet respectively, each blanking opening (220) being provided with a deflection means (221) controllable by a blanking signal (911) between two deflection states, namely, a first state ('switched on') when the deflection means has assumed a state in which particles radiated through the opening are allowed to travel along a desired path (pl), and a second state ('switched off') when the deflection means is deflecting particles radiated through the opening off said path (pl), wherein the positions of the apertures (21) in the pattern definition field (pf) taken with respect to a direction (Y) perpendicular to a scanning direction and/or a direction (X) taken with respect to a direction parallel to said scanning direction are offset to each other by not only multiple integers of the effective width (w) of an aperture taken along said direction, but also additional multiple integers of an integer fraction of said effective width ('fractional offsets'), said scanning direction (sd) denoting a direction along which an image of the apertures formed by said beam on a target surface is moved over the target surface during an irradiation process.

2. The device of claim 1, comprising an aperture array means (203) for forming a number of beamlets and a blanking means (202) for controlling the passage of selected beamlets, said aperture array means (203) having a plurality of apertures (21,230) of identical shape defining the shape of beamlets (bm) permeating said apertures, wherein the apertures (21) are arranged within a pattern definition field (pf) in which the positions of the apertures (21) taken with respect to a direction (Y) perpendicular to the scanning direction and/or a direction (X) taken with respect to a direction parallel to the scanning direction are offset to each other by not only multiple integers of the effective width of an aperture taken along said direction, but also by additional multiple integers of an integer fraction of said effective width ('fractional offsets'), and said blanking means (202)

having a plurality of blanking openings (220) arranged in an arrangement corresponding to the apertures (230) of the aperture array means (203).

3. The device of claim 1, wherein the fractional offsets are integer multiples of $\frac{1}{2}^N$ times the effective width of an aperture, where N is a positive integer, preferably greater than 1.

4. The device of claim 1, wherein the pattern definition field (pf) is segmented into several domains (D), each domain being composed of a plurality of staggered lines (pl) of apertures running along the scanning direction, wherein the apertures are spaced apart within said lines by an integer multiple of the effective width (w) of an aperture and are offset between neighboring lines by a fraction (mw) of said integer multiple width, wherein along the direction perpendicular to the scanning direction, the apertures of a domain are offset to each other by multiple integers of the effective width (w) of an aperture, whereas the offsets of apertures of different domains are fractional offsets.

5. The device of claim 4, wherein the domains have arrangements of apertures which are corresponding as regards the relative position of aperture within each domain.

6. The device of claim 5, wherein the domains have the same number of apertures.

7. The device of claim 4, wherein the fractional offsets are integer multiples of $\frac{1}{2}^N$ times the effective width of an aperture, where N is a positive integer greater than 1, and the number of domains with different fractional offsets is $2^{2N-1}$.

8. The device of claim 4, wherein the fractional offsets are integer multiples of $\frac{1}{2}^N$ times the effective width of an aperture, where N is a positive integer greater than 1, and the number of domains with different fractional offsets is $2^N$, the fractional offsets running along a diagonal of an aperture's base shape.

9. The device of claim 1, wherein the blanking signals are fed to the pattern definition field (pf) partly at a side running parallel to the scanning direction, partly at a side running perpendicular.

10. The device of claim 1, wherein the shape of the apertures is substantially equivalent to a two-dimensional geometrical base shape of a contiguous covering of the plane.

11. The device of claim 10, wherein the base shape is a square.

12. The device of claim 1, comprising blanking openings whose line feeding the respective blanking signal comprises a component which is accessible on a surface of the device by a structural modification and which is adapted to change its transmissivity for the respective blanking signal between a electrical connecting state and a blocking state upon treatment by said structural modification.

13. The device of claim 12, wherein the component is realized as a conductor segment adapted to be irreversibly modified between an electrical well-conducting and a non-conducting state.

14. The device of claim 1, wherein the blanking signals are derived from feeding lines, each feeding line serving blanking signals for a number of blanking openings, which are propagated through a series of shift registers into a sequence of intermediate buffer means, one buffer means for each blanking opening, and the data contained in the buffer means are activated by a common trigger signal.

15. The device of claim 14, wherein the blanking signal for each blanking opening is a multi-bit signal, said signal coding a duration of how long within one exposure time the respective aperture is switched on.

16. The device of claim 1, wherein the deflection means are adapted to deflect, in the switched off state, the particles to an absorbing surface (204) of said exposure apparatus (100) mounted after the device as seen in the direction of the particle beam.

17. The device of claim 10, wherein the shape of the apertures is equivalent to a two-dimensional polygonal base shape of a contiguous covering of the plane, with rounded and/or beveled edges.

18. The device of claim 17, wherein the area of the shape of the apertures is the same as that of the original polygonal base shape.

19. The device of claim 17, wherein the shape of the apertures is a corner-rounded square.

* * * * *